US010530382B2

(12) United States Patent
Kong et al.

(10) Patent No.: US 10,530,382 B2
(45) Date of Patent: Jan. 7, 2020

(54) SUCCESSIVE APPROXIMATION REGISTER ANALOG-TO-DIGITAL CONVERTER AND CONVERSION METHOD THEREFOR

(71) Applicant: Shanghai Huahong Grace Semiconductor Manufacturing Corporation, Shanghai (CN)

(72) Inventors: Weiran Kong, Shanghai (CN); Bin Zhang, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/202,853

(22) Filed: Nov. 28, 2018

(65) Prior Publication Data
US 2019/0348994 A1    Nov. 14, 2019

(30) Foreign Application Priority Data

May 10, 2018   (CN) .......................... 2018 1 0442221

(51) Int. Cl.
*H03M 1/12*  (2006.01)
*H03M 1/46*  (2006.01)

(52) U.S. Cl.
CPC ........... *H03M 1/468* (2013.01); *H03M 1/462* (2013.01)

(58) Field of Classification Search
CPC ........ H03M 1/468; H03M 1/462; H03M 1/10; H03M 1/12; H03M 1/00; H03M 1/802; H03M 1/804; H03M 1/806
USPC ........................................ 341/155, 161, 172
See application file for complete search history.

(56) References Cited

U.S. PATENT DOCUMENTS

| 7,015,853 | B1* | 3/2006 | Wolff | H03M 1/0641 341/155 |
| 7,515,083 | B2* | 4/2009 | Chen | H03M 1/145 341/156 |
| RE42,878 | E * | 11/2011 | Chen | H03M 1/145 341/156 |
| 8,120,520 | B2* | 2/2012 | Jeong | H03M 1/46 341/155 |
| 8,502,723 | B2* | 8/2013 | Chen | H03M 1/1061 341/120 |
| 8,659,462 | B2* | 2/2014 | Kang | H03M 1/08 341/155 |
| 8,786,483 | B1* | 7/2014 | Thompson | H03M 1/0836 341/120 |

(Continued)

*Primary Examiner* — Jean B Jeanglaude
(74) *Attorney, Agent, or Firm* — Murtha Cullina LLP

(57) ABSTRACT

An SAR ADC and a conversion method, which include an SAR control logic circuit configured to control A/D conversion by: 1) sampling analog input signal for first time; 2) subjecting the sampled signal to conversions; 3) sampling analog input signal for another time; 4) subjecting the sampled signal in step 3) to conversion including: i) determining whether the lowest M bits of previous N-bit digital output signal are 1's or 0's, if so, looping back to step 2), otherwise, proceeding to step ii); ii) performing conversions on lowest M bits of new N-bit digital output signal, directly taking N-th to (M+1)-th bits of previous N-bit digital output signal as N-th to (M+1)-th bits of new N-bit digital output signal, and repeating steps 3) and 4) until the analog input signal is fully sampled and converted. Required cycles can be reduced resulting in higher conversion rate and lower power consumption.

15 Claims, 4 Drawing Sheets

(56) References Cited

U.S. PATENT DOCUMENTS

| | | | | |
|---|---|---|---|---|
| 8,866,653 B2* | 10/2014 | Tsai | ................ | H03M 1/462 |
| | | | | 341/122 |
| 2010/0259432 A1* | 10/2010 | Ishikawa | ............ | H03M 1/468 |
| | | | | 341/144 |
| 2015/0162926 A1* | 6/2015 | Jung | ................ | H03M 1/0845 |
| | | | | 341/122 |
| 2015/0263756 A1* | 9/2015 | Chiu | ................ | H03M 1/468 |
| | | | | 341/118 |
| 2017/0163276 A1* | 6/2017 | Chen | ................ | A61B 8/4494 |
| 2017/0346497 A1* | 11/2017 | Durston | ............ | H03M 1/0658 |

* cited by examiner

SUCCESSIVE APPROXIMATION REGISTER ANALOG-TO-DIGITAL CONVERTER AND CONVERSION METHOD THEREFOR

CROSS-REFERENCE TO RELATED APPLICATION

This application claims the priority of Chinese patent application number 201810442221.2, filed on May 10, 2018, the entire contents of which are incorporated herein by reference.

TECHNICAL FIELD

The present invention relates to the fabrication of semiconductor integrated circuits (ICs), and in particular, to a successive approximation register (SAR) analog-to-digital converter (ADC). The present invention also relates to a conversion method for the SAR ADC.

BACKGROUND

Successive approximation register (SAR) analog-to-digital converters (ADCs) are widely used because of a variety of advantages including a medium conversion accuracy (8-16 bits), a medium conversion rate (up to 5 Msps), a low power consumption, a low cost, compatibility with modern CMOS processes and easy scaling down.

FIG. 1 is a schematic view of a conventional SAR ADC, comprising a sample-and-hold circuit, an N-bit digital-to-analog converter (DAC), a comparator 103 and an SAR control logic circuit 102. In general, the sample-and-hold circuit and the N-bit DAC is both provided by a capacitor array 101. As an important component relating to conversion accuracy and rate, the DAC plays a key role in halving a reference voltage (Vref).

The SAR ADC performs binary searches to determine the closest digital value that fits an analog input signal.

The analog input signal, i.e., an input voltage Vin, is compared to known reference voltages Vrefn and Vrefp for multiple times under a control of the SAR control logic circuit 102 so that the converted digital numbers successively approximate the numerical value corresponding to the input analog quantity.

In the sampling phase, the analog input signal is sampled onto the capacitor array 101 of the DAC.

After the conversion begins, under the control of a clock input, the SAR control logic circuit 102 controls the N-bit DAC to output a ½Vref analog signal, followed by comparing the sampled signal with ½Vref to determine the most significant bit (MSB). A second comparison is then performed, in which the N-bit DAC outputs a ¾Vref or ¼Vref analog signal based on the MSB value, and the sampled signal is then compared with ¾Vref or ¼Vref to determine the second MSB. This process is repeated, with the comparator 103 successively comparing the input signal, until the least significant bit (LSB) is determined, thereby completing the algorithm.

The sample-and-hold circuit and the N-bit DAC are usually both provided by the capacitor array 101. FIG. 2 shows a conventional 12-bit SAR ADC adopting a single-stage capacitor array architecture known to include 12 binary-weighted capacitors and one terminating capacitor C113. The binary-weighted capacitors' capacitance is successively doubled, from that of the LSB capacitor C101 defined as one unit of capacitance C to that of the MSB capacitor C112 equating to $2^{11}$ C. The terminating capacitor C113 also has a capacitance of 1 C. Top plates of the binary-weighted capacitors and of the terminating capacitor C113 are connected together and provide an output Vout. In addition, bottom plates of the binary-weighted capacitors and of the terminating capacitor C113 are coupled to respective one-pole-three-throw (SP3T) switches. Under the control of a control signal, each of the SP3T switches is coupled at the other end to one of the input voltage Vin, the positive reference voltage Vrefp and the negative reference voltage Vrefn. In scenarios where the differential reference voltage signals Vrefp and Vrefn are not used, each of the SP3T switches may alternatively be, under the control of a control signal, coupled at the other end to one of the input voltage Vin, a reference voltage and the ground. The output Vout is coupled to a common-mode level Vcm via a switch.

Most existing 12-bit SAR ADC capacitor arrays adopt a two-stage architecture having two capacitor arrays which are connected together by a coupling capacitor and have the same binary-weighted bits in order to minimize the energy consumption of capacitors and switches. Such as a conventional 12-bit SAR ADC two-stage capacitor array, as shown in FIG. 3, has a first capacitor sub-array and a second capacitor sub-array connected thereto by a coupling capacitor C214. The first capacitor sub-array contains binary-weighted capacitors C201-C206 and a terminating capacitor C213, and the second capacitor sub-array contains binary-weighted capacitors C207-C212. Capacitances of the aforesaid respective capacitors are also given in FIG. 3. In order to comply with the binary weighting scheme, the coupling capacitor is selected as a fractional capacitor having a capacitance of 64/63 C so that compared to a change that a signal will experience when it is input at the bottom plate of the binary-weighted capacitor C206 and output from the output Vout, it will change by twice as much when it is input at the bottom plate of the binary-weighted capacitor C207 and output from the output Vout.

There are also conventional 12-bit SAR ADCs using three-stage capacitor arrays.

An analog-to-digital (A/D) conversion performed by a conventional SAR ADC on an analog input signal consists of repeated cycles of sampling and SAR A/D conversion until the A/D conversion is completed. FIG. 4 is a diagram illustrating the timings of an A/D conversion process of a conventional 12-bit SAR ADC, the timings including operating timing, corresponding clock and sampling signal timing.

When the sampling signal is at a high level, the analog input signal is sampled, and the sampling lasts for one cycle of the clock signal, i.e., the clock cycle indicated at 1 in FIG. 4.

An idle cycle follows, in which nothing is done, i.e., the clock cycle indicated at 2 in the figure.

Subsequently, 12 successively A/D conversions are carried out, indicated respectively at Bit1, Bit2, . . . , Bit12 in FIG. 4. Wherein, Bit1 denotes the conversion for deriving a value for the MSB (the twelfth bit) in a target 12-bit digital output signal; Bit2, that for deriving a value for the eleventh bit therein; . . . ; and Bit12, that for deriving a value for the lowest first bit therein, and hence the successive A/D conversions of the sampling signal are completed. After that, another sample-and-convert cycle is commenced. As can be seen from the figure, each of those successive A/D conversions for obtaining the value of a corresponding bit lasts for one clock cycle. That is, they last for a total period of 12 clock cycles, i.e., those respectively indicated at 3, 4, . . . , 14 in FIG. 4.

Therefore, each sample-and-convert cycle in the conventional SAR A/D conversion process covers 14 clock cycles. However, in practice, as the analog input signal is usually a continuous signal, any two successive sampled analog signals typically do not differ much from each other. As a result, the two digital output signals converted from those two analog signals tend to assume the same values at several highest bits and exhibit differences at the remaining low bits. For this reason, the conventional SAR A/D conversion solution that treats each sampled signal with the complete process spanning 14 clock cycles is considered to have a low clock utilization and an unnecessary power consumption.

SUMMARY OF THE INVENTION

It is an object of the present invention to provide a successive approximation register (SAR) analog-to-digital converter (ADC) with an increased analog-to-digital (A/D) conversion rate and a reduced power consumption. It is another object of the present invention to provide an SAR A/D conversion method.

To this end, the SAR ADC provided in the present invention includes a sample-and-hold circuit, an N-bit digital-to-analog converter (DAC), a comparator and an SAR control logic circuit.

The SAR control logic circuit has a data output that outputs an N-bit digital output signal resulting from an A/D conversion performed by the SAR ADC, where N is a positive integer.

The SAR control logic circuit further has a control signal output that provides an N-bit logic control signal to the N-bit DAC and is configured to control an SAR A/D conversion by the sequential including:

1) sampling an analog input signal Vin for a first time to acquire a sampled signal;

2) subjecting the sampled signal to the SAR A/D conversion each of an N-th SAR A/D conversion to a first SAR A/D conversion to obtain bits, from a highest N-th bit to a lowest first bit, of an N-bit digital output signal, outputting the N-bit digital output signal and taking the output N-bit digital output signal as a previous N-bit digital output signal;

3) sampling the analog input signal Vin for another time to acquire a new sampled signal; and 4) subjecting the new sampled signal acquired in step 3 to the SAR A/D conversion comprising the sub-steps of:

i) determining whether each of an M-th to a first bits of the previous N-bit digital output signal has a value of all 1 or whether each of an M-th to a first bits of the previous N-bit digital output signal has a value of 0, looping back to step 2) if each of the M-th to first bits of the previous N-bit digital output signal has a value of 1 or if each of the M-th to first bits of the previous N-bit digital output signal has a value of 0, or proceeding to step ii) if the values of the M-th to first bits of the previous N-bit digital output signal are not all 1's or 0's, where M is an integer smaller than N and greater than 1; and ii) directly taking the N-th to (M+1)-th bits of the previous N-bit digital output signal as the N-th to (M+1)-th bits of a new N-bit digital output signal, subjecting the new sampled signal each of the M-th SAR A/D conversion to the first SAR A/D conversion and taking the new N-bit digital output signal as updated previous N-bit digital output signal.

Steps 3) and 4) are then repeated until the analog input signal is fully sampled and A/D-converted.

In a more preferred embodiment, the sequential steps are performed under a control of a clock signal, wherein the sampling in each of the steps 1 and 3 lasts for one clock cycle, and wherein the SAR A/D conversion in each of steps 2) and ii) is conducted one clock cycle after completion of the corresponding sampling.

In a more preferred embodiment, each of the SAR A/D conversion lasts for one clock cycle, wherein the SAR A/D conversions in step 2) totally last for N clock cycles, and wherein the SAR A/D conversions in step ii) totally last for M clock cycles.

In a more preferred embodiment, the sample-and-hold circuit and the N-bit DAC are both implemented by a capacitor array comprising a switch array, wherein the SAR control logic circuit controls states of switches in the switch array so as to enable control of the sampling and SAR A/D conversion.

In a more preferred embodiment, the capacitor array is a multiple-stage capacitor array.

In a more preferred embodiment, N is 12.

In a more preferred embodiment, M is 6.

The above objects are also attained by an SAR A/D conversion method implemented by an SAR ADC comprising a sample-and-hold circuit, an N-bit DAC, a comparator and an SAR control logic circuit.

The SAR control logic circuit has a data output that outputs an N-bit digital output signal resulting from an A/D conversion performed by the SAR ADC, where N is a positive integer.

The SAR control logic circuit further has a control signal output that provides an N-bit logic control signal to the N-bit DAC and is configured to control an A/D conversion control process by sequential steps including:

1) sampling an analog input signal Vin for a first time to acquire a sampled signal; 2) subjecting the sampled signal to each of an N-th SAR A/D conversion to a first SAR A/D conversion to obtain bits, from the highest N-th bit to the lowest first bit, of an N-bit digital output signal, outputting the N-bit digital output signal and taking the output N-bit digital output signal as a previous N-bit digital output signal;

3) sampling the new analog input signal Vin for another time to acquire a new sampled signal; and 4) subjecting the new sampled signal acquired in step 3 to the SAR A/D conversion comprising the sub-steps of:

i) determining whether each of a M-th to first bits of the previous N-bit digital output signal has a value of 1 or whether each of the M-th to first bits of the previous N-bit digital output signal has a value of 0, looping back to step 2) if each of the M-th to first bits of the previous N-bit digital output signal has a value of 1 or if each of the M-th to first bits of the previous N-bit digital output signal has a value of 0, or proceeding to step ii) if the M-th to first bits of the previous N-bit digital output signal are not all 1's or 0's, where M is an integer smaller than N and greater than 1; and ii) directly taking the N-th to (M+1)-th bits of the previous N-bit digital output signal as the N-th to (M+1)-th bits of a new N-bit digital output signal, subjecting the new sampled signal to each of the M-th SAR A/D conversion to the first SAR A/D conversion to obtain bits, from the M-th to first bits of the new N-bit digital output signal and taking the new N-bit digital output signal as updated previous N-bit digital output signal.

Steps 3) and 4) are then repeated until the analog input signal is fully sampled and A/D-converted.

In a more preferred embodiment, the sequential steps are performed under a control of a clock signal, wherein the sampling in each of steps 1) and 3) lasts for one clock cycle, and wherein the SAR A/D conversion in each of steps 2) and ii) is conducted one clock cycle latter after the completion of the corresponding sampling.

In a more preferred embodiment, each of the SAR A/D conversions lasts for one clock cycle, wherein the SAR A/D conversions in step 2) totally last for N clock cycles, and wherein the SAR A/D conversion in step ii) totally last for M clock cycles.

In a more preferred embodiment, the sample-and-hold circuit and the N-bit DAC are both implemented by a capacitor array comprising a switch array, wherein the SAR control logic circuit controls states of switches in the switch array so as to enable sampling and the SAR A/D conversion.

In a more preferred embodiment, the capacitor array is a multiple-stage capacitor array.

In a more preferred embodiment, the capacitor array utilizes a binary-weighting scheme for the capacitances of capacitors therein.

In a more preferred embodiment, N is 12.

In a more preferred embodiment, M is 6.

According to the present invention, a particular sequential step for A/D conversion controlled by SAR control logic circuit is configured. In the A/D conversion, only the first sampled signal undergoes a SAR A/D conversion for a complete timing so as to determine all bits for a corresponding first digital output signal, with every subsequently sampled signal being subjected to an SAR A/D conversion depending on the previous N-bit digital output signal. In this way, for any signal sampled from the analog input signal Vin, which does not exhibit a significant change from the immediately previous sampled signal and keeps the same values of several highest bits of its corresponding N-bit digital output signal as those of the N-bit digital output signal corresponding to the previous sampled signal, only the values of the remaining lower bits (e.g., those lower than the M-th bit) needs to be determined by SAR A/D conversions. As a result, the number of clock cycles for SAR A/D conversions of the sampled signals can be reduced, leading to a higher A/D conversion rate and a lower power consumption.

BRIEF DESCRIPTION OF THE DRAWINGS

The present invention will be described in greater detail below with reference to the accompanying drawings which illustrates some specific embodiments of the invention.

DETAILED DESCRIPTION

Figure 1:
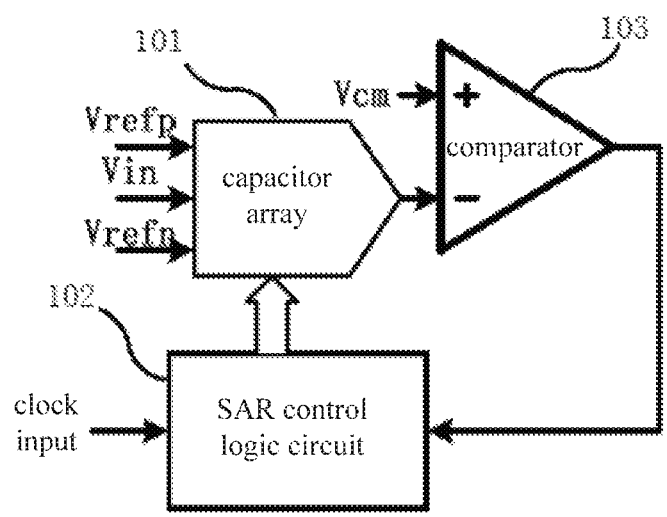
FIG. 1 is a schematic view of a conventional SAR ADC.
Figure 5A:
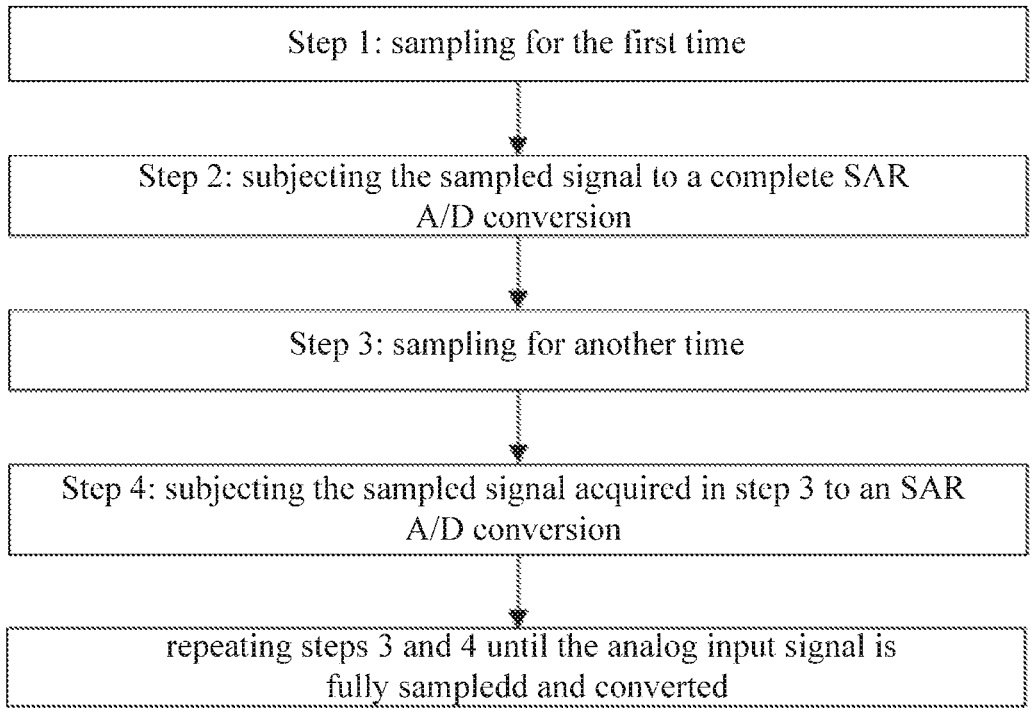
FIGS. 5A and 5B illustrates a flowchart of sequential steps performed by an SAR control logic circuit according to an embodiment of the present invention.
Figure 5B:
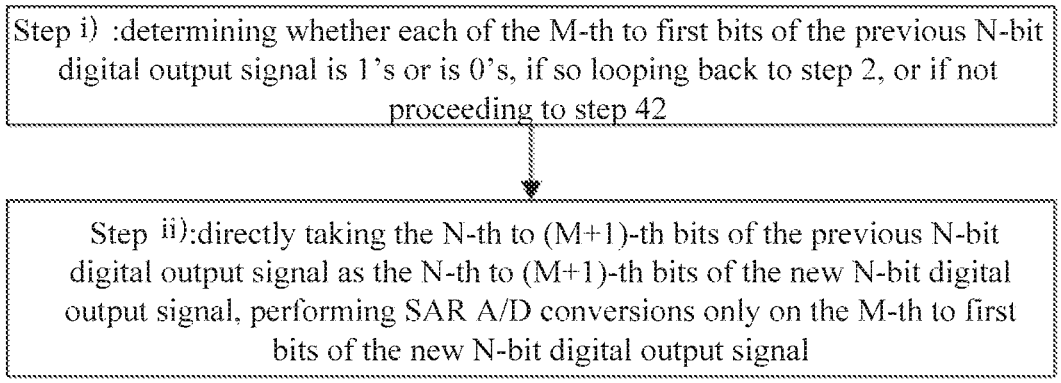

FIGS. 5A and 5B illustrates a flowchart of sequential steps performed by a successive approximation register (SAR) control logic circuit 102 according to an embodiment of the present invention. According to an embodiment of the present invention, the SAR analog-to-digital converter (ADC), as schematically illustrated in FIG. 1, includes a sample-and-hold circuit, an N-bit digital-to-analog converter (DAC), a comparator 103, and the SAR control logic circuit 102.

According to an embodiment of the present invention, the sample-and-hold circuit and the N-bit DAC may be both implemented by a capacitor array 101 comprising a switch array. The SAR control logic circuit 102 may control switching of switches in the switch array so as to enable control of the sampling and SAR A/D conversion operations.

The capacitor array 101 may utilize a binary-weighting scheme for the capacitances of adjacent capacitors. That is, the capacitance of any capacitor is twice that of a capacitor immediately downstream thereof.

Figure 2:
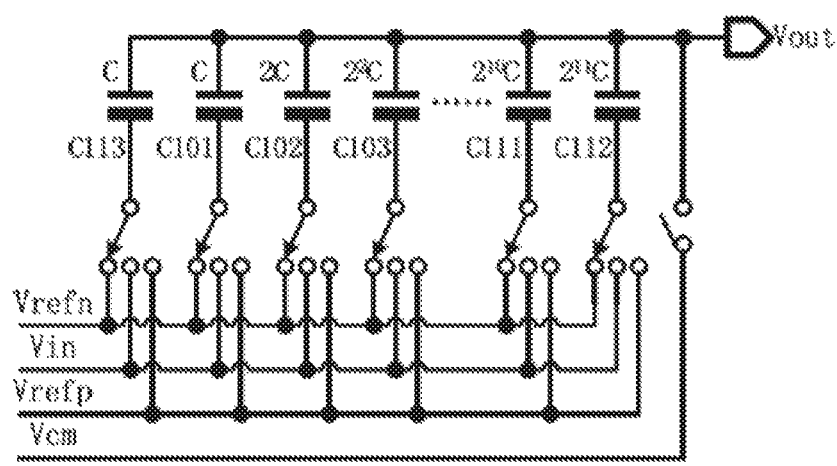
FIG. 2 schematically illustrates a single-stage capacitor array in a conventional 12-bit SAR ADC.
Figure 3:
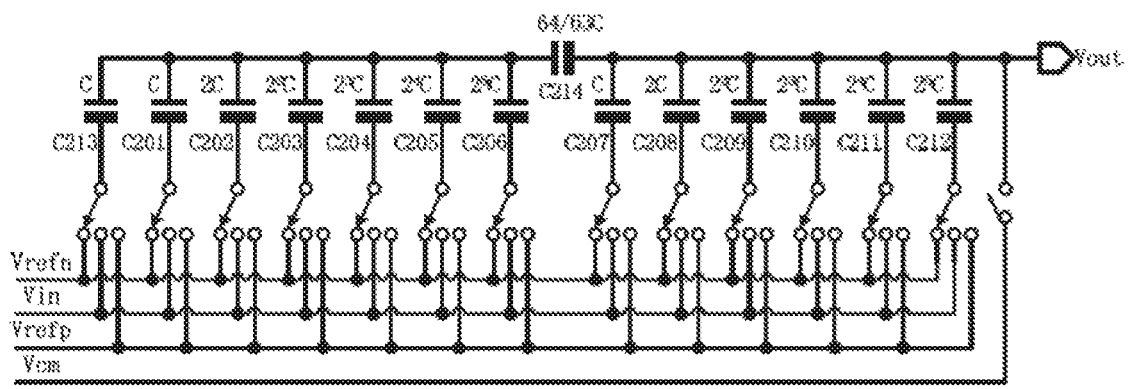
FIG. 3 schematically illustrates a two-stage capacitor array in a conventional 12-bit SAR ADC.

According to an embodiment of the present invention, the capacitor array 101 may either be a single-stage capacitor array, as shown in FIG. 2, or a multiple-stage capacitor array, as shown in FIG. 3.

The SAR control logic circuit 102 has a data output that outputs an N-bit digital output signal resulting from A/D conversions carried out by the SAR ADC, where N is a positive integer.

Figure 4:
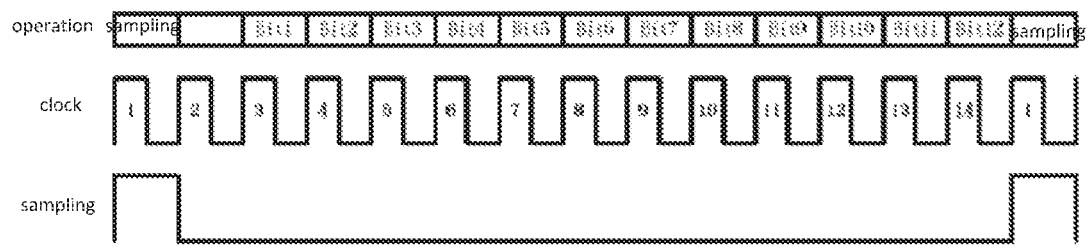
FIG. 4 is a timing diagram illustrating the successive SAR A/D conversions of a conventional 12-bit SAR ADC.

The SAR control logic circuit 102 also has a control signal output that provides the N-bit logic control signals with the N-bit DAC. The SAR control logic 102 control an SAR A/D conversion process by sequential steps including:

1) sampling an analog input signal Vin for the first time to acquire a sampled signal;

2) subjecting the sampled signal to each of an N-th SAR A/D conversion to a first SAR A/D conversion to obtain bits, from the highest N-th bit to the lowest first bit, of an N-bit digital output signal, outputting the N-bit digital output signal and taking the output N-bit digital output signal as a previous N-bit digital output signal;

According to an embodiment of the present invention, N is 12. In other embodiments, N may also be a different number such as 8, 10, 14 or the like. Reference can be made to FIG. 4 for a timing diagram of step 2)

3) sampling the analog input signal Vin for another time to acquire a new sampled signal; and 4) subjecting the new sampled signal acquired in step 3 to an SAR A/D conversion, including the sub-steps of:

i) determining whether each of the M-th to first bits of the previous N-bit digital output signal has a value of 1 or whether each of the M-th to first bits of the previous N-bit digital output signal has a value of 0, and if each of the M-th to first bits of the previous N-bit digital output signal has a value of 1 or if each of the M-th to first bits of the previous N-bit digital output signal has a value of 0, looping back to step 2);

In step i), when each of the M-th to first bits of the previous N-bit digital output signal has a value of 1 or 0, it is indicated that a difference between the two successive sampled signals has exceeded the descriptive ability of the lowest M bits of the digital output signal, it is necessary to loop back to step 2) to subject the signal to the complete SAR A/D conversion process.

If the values of the M-th to first bits of the previous N-bit digital output signal are not all 1's or 0's, step ii) is carried out, where M is an integer smaller than N and greater than 1; and ii) directly taking the N-th to (M+1)-th bits of the previous N-bit digital output signal as the N-th to (M+1)-th bits of a new N-bit digital output signal, subjecting the new sampled signal to each of the M-th SAR A/D conversion to the first SAR A/D conversion to obtain bits, from the M-th to first bits of the new N-bit digital output signal, and taking the new N-bit digital output signal with the N-th to first bits as the updated N-bit digital output signal.

Figure 6:
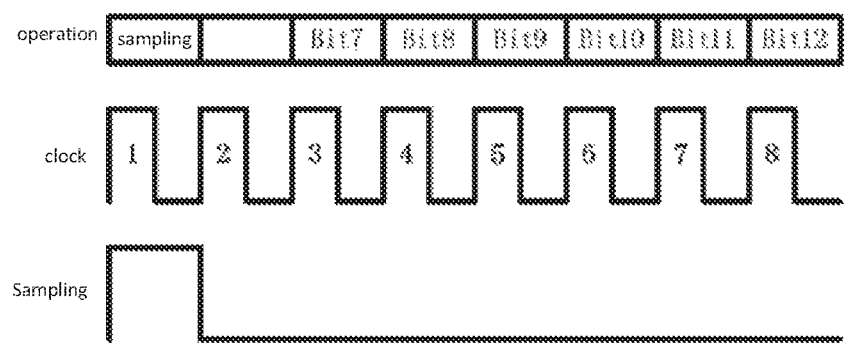
FIG. 6 is a timing diagram illustrating successive SAR A/D conversions conducted in step ii according to an embodiment of the present invention.

According to an embodiment of the present invention, M is 6, i.e., half N. In other embodiments, M may also be greater or less than half N and may vary with N. FIG. 6 shows a timing diagram of the operations in step ii). Compared to FIG. 4, the operations for Bit1 to Bit6 are absent from FIG. 6. In other words, as the highest 6 bits of the new N-bit digital output signal directly inherits the value of the highest 6 bits of the previous N-bit digital output signal, the operations for Bit1 to Bit6 are unnecessary. In this way, the six clock cycles corresponding to the operations for Bit1 to Bit6 can be saved.

The foregoing sequential steps may be performed under the control of a clock signal. The sampling operations in steps 1) and 3) may be each carried out for one clock cycle when the sampling clock signal is high. For each sampled analog signal, the first A/D conversion may be conducted one clock cycle (i.e., the clock cycle indicated at 2 in FIGS. 4 and 6) later after the completion of the corresponding sampling operation.

Each SAR A/D conversion may last for one clock cycle. Accordingly, the SAR A/D conversions in step 2) totally require N clock cycles (14 clock cycles in the embodiment of FIG. 4), and those in step ii) require M clock cycles (8 clock cycles in the embodiment of FIG. 6).

After that, steps 3) and 4) may be repeated until the analog input signal Vin is fully sampled and converted.

According to the present invention, in the SAR A/D conversion method carried out by the SAR control logic circuit 102, only the first sampled signal undergoes a complete SAR A/D conversion process for determining the values of all bits for a corresponding first digital output signal, with every subsequently sampled signal being subjected to an SAR A/D conversion process depending upon the bit values of the previous N-bit digital output signal. In this way, for any signal sampled from the analog input signal Vin, which does not exhibit a significant change from the immediately previous sampled signal and keeps the same values of several highest bits of its corresponding N-bit digital output signal as those of the N-bit digital output signal corresponding to the previous sampled signal, only the values of the remaining lower bits (e.g., those lower than the M-th bit) needs to be determined by SAR A/D conversions. As a result, the number of clock cycles for SAR A/D conversions of the sampled signals can be reduced, leading to a higher A/D conversion rate and a lower power consumption.

According to an embodiment of the present invention, a SAR A/D conversion method is implemented by a SAR ADC comprising a sample-and-hold circuit, an N-bit DAC, a comparator 103 and an SAR control logic circuit 102.

According to an embodiment of the present invention, the sample-and-hold circuit and the N-bit DAC may be both implemented by a capacitor array 101 comprising a switch array. The SAR control logic circuit 102 may control switching of switches in the switch array so as to enable control of sampling and SAR A/D conversion operations.

The capacitor array 101 may utilize a binary-weighting scheme for the capacitances of adjacent capacitors. That is, the capacitance of any capacitor is twice that of a capacitor immediately downstream thereof.

According to an embodiment of the present invention, the capacitor array 101 may either a single-stage capacitor array, as shown in FIG. 2, or a multiple-stage capacitor array, as shown in FIG. 3.

The SAR control logic circuit 102 has a data output that outputs an N-bit digital output signal resulting from an A/D conversion carried out by the SAR ADC, where N is a positive integer.

The SAR control logic 102 also has a control signal output that provides the N-bit DAC with N-bit logic control signals. The SAR control logic circuit 102 control an A/D conversion by sequential steps including:

1) sampling an analog input signal Vin for the first time to acquire a sampled signal;

2) subjecting the sampled signal to each of an N-th SAR A/D conversion to a first SAR A/D conversion to obtain bits, from the highest N-th bit to the lowest first bit, of an N-bit digital output signal, outputting the N-bit digital output signal and taking the output N-bit digital output signal as a previous N-bit digital output signal;

According to an embodiment of the present invention, N is 12. In other embodiments, N may also be a different number such as 8, 10, 14 or the like. Reference can be made to FIG. 4 for a timing diagram of step 2).

3) sampling the analog input signal Vin for another time to acquire a new sampled signal; and 4) subjecting the new sampled signal acquired in step 3) to the SAR A/D conversion, including the sub-steps of:

i) determining whether each of the M-th to first bits of the previous N-bit digital output signal has a value of 1 or whether each of the M-th to first bits of the previous N-bit digital output signal has a value of 0, looping back to step 2) if each of the M-th to first bits of the previous N-bit digital output signal has a value of 1 or if each of the M-th to first bits of the previous N-bit digital output signal has a value of 0, or proceeding to step ii) if the values of the M-th to first bits of the previous N-bit digital output signal are not all 1's or 0's, where M is an integer smaller than N and greater than 1; and;

In step i), when each of the M-th to first bits of the previous N-bit digital output signal has a value of 1 or 0, it is indicated that the difference between the two successive sampled signals has exceeded the descriptive ability of the lowest M bits of the digital output signal, it is necessary to loop back to step 2) to subject the sampled signal to the complete SAR A/D conversion process.

If the values of the M-th to first bits of the previous N-bit digital output signal are not all 1's or 0's, step ii) is carried out, where M is an integer smaller than N and greater than 1.

ii) directly taking the N-th to (M+1)-th bits of the previous N-bit digital output signal as the N-th to (M+1)-th bits of the new N-bit digital output signal, subjecting the new sampled signal to each of the M-th SAR A/D conversion to the first SAR A/D conversion to obtain bits, from the M-th to first bits of the new N-bit digital output signal, and taking the new N-bit digital output signal with the N-th to first bits as updated previous N-bit digital output signal.

According to an embodiment of the present invention, M is 6, i.e., half N. In other embodiments, M may also be greater or smaller than half N and may vary with N. FIG. 6 shows a timing diagram of the operations in step ii). Compared to FIG. 4, the operations for Bit1 to Bit6 are absent from FIG. 6. In other words, as the highest 6 bits of the new N-bit digital output signal directly inherits the value of the highest 6 bits of the previous N-bit digital output signal, the operations for Bit1 to Bit6 are unnecessary. In this way, the six clock cycles corresponding to the operations for Bit1 to Bit6 can be saved.

The foregoing sequential steps may be performed under the control of a clock signal. The sampling operations in steps 1) and 3) may each last for one clock cycle (i.e., the clock cycle indicated at 1 in FIGS. 4 and 6). For each sampled analog signal, the first A/D conversion may be conducted one clock cycle (i.e., the clock cycle indicated at 2 in FIGS. 4 and 6) later after the completion of the corresponding sampling operation.

Each SAR A/D conversion may last for one clock cycle. Accordingly, the SAR A/D conversions in step 2 totally require N clock cycles (14 clock cycles in the embodiment of FIG. 4), and those in step ii require M clock cycles (8 clock cycles in the embodiment of FIG. 6).

After that, steps 3) and 4) may be repeated until the analog input signal Vin is fully sampled and converted.

While the invention has been described above with reference to several preferred embodiments, its scope is in no way limited to these embodiments. Any and all changes and modifications made by those of ordinary skill in the art based on the above teachings fall within the scope as defined in the appended claims.

What is claimed is:

1. A successive approximation register (SAR) analog-to-digital converter (ADC), comprising a sample-and-hold circuit, an N-bit digital-to-analog converter (DAC), a comparator and an SAR control logic circuit, the SAR control logic circuit having a data output that outputs an N-bit digital output signal resulting from an analog-to-digital (A/D) conversion performed by the SAR ADC, where N is a positive integer, the SAR control logic circuit further having a control signal output that provides an N-bit logic control signal to the N-bit DAC, the SAR control logic circuit configured to control an SAR A/D conversion process by sequential steps including:

1) sampling an analog input signal for a first time to acquire a sampled signal;

2) subjecting the sampled signal to each of an N-th SAR A/D conversion to a first SAR A/D conversion to obtain bits, from a highest N-th bit to a lowest first bit, of an N-bit digital output signal, outputting the N-bit digital output signal and taking the output N-bit digital output signal as a previous N-bit digital output signal;

3) sampling the analog input signal for another time to acquire a new sampled signal; and 4) subjecting the new sampled signal acquired in step 3 to the SAR A/D conversion, wherein step 4) comprises:

i) determining whether each of an M-th to a first bits of the previous N-bit digital output signal has a value of 1 or whether each of an M-th to a first bits of the previous N-bit digital output signal has a value of 0, looping back to step 2) if each of the M-th to first bits of the previous N-bit digital output signal has a value of 1 or if each of the M-th to first bits of the previous N-bit digital output signal has a value of 0, or proceeding to step ii) if the values of the M-th to first bits of the previous N-bit digital output signal are not all 1's or 0's, where M is an integer smaller than N and greater than 1; and ii) directly taking the N-th to (M+1)-th bits of the previous N-bit digital output signal as the N-th to (M+1)-th bits of a new N-bit digital output signal, subjecting the new sampled signal to each of the M-th SAR A/D conversion to the first SAR A/D conversion to obtain bits, from the M-th to first bits of the new N-bit digital output signal by conducting M conversions, taking the new N-bit digital output signal with the N-th to first bits as updated previous N-bit digital output signal, and repeating steps 3) and 4) until the analog input signal is fully sampled and A/D-converted.

2. The SAR ADC of claim 1, wherein the sequential steps are performed under a control of a clock signal, wherein the sampling in each of steps 1) and 3) lasts for one clock cycle, and wherein the SAR A/D conversion in each of steps 2) and ii) is conducted one clock cycle latter after completion of the corresponding sampling.

3. The SAR ADC of claim 2, wherein each of the SAR A/D conversions lasts for one clock cycle, wherein the SAR A/D conversions in step 2) totally last for N clock cycles, and wherein the SAR A/D conversions in step ii) totally last for M clock cycles.

4. The SAR ADC of claim 1, wherein the sample-and-hold circuit and the N-bit DAC are implemented by a capacitor array and a switch array, and wherein the SAR control logic circuit controls states of switches in the switch array so as to enable control of the sampling and the SAR A/D conversion.

5. The SAR ADC of claim 4, wherein the capacitor array is a multiple-stage capacitor array.

6. The SAR ADC of claim 1, wherein N is 12.

7. The SAR ADC of claim 6, wherein M is 6.

8. A successive approximation register (SAR) analog-to-digital (A/D) conversion method implemented by an SAR analog-to-digital converter (ADC), the SAR ADC comprising a sample-and-hold circuit, an N-bit digital-to-analog converter (DAC), a comparator and an SAR control logic circuit, the SAR control logic circuit having a data output that outputs an N-bit digital output signal resulting from an A/D conversion performed by the SAR ADC, where N is a positive integer, the SAR control logic circuit further having a control signal output that provides an N-bit logic control signal to the N-bit DAC, the SAR control logic circuit configured to control an SAR A/D conversion process by sequential steps including:

1) sampling an analog input signal for a first time to acquire a sampled signal;

2) subjecting the sampled signal to each of an N-th SAR A/D conversion to a first SAR A/D conversion to obtain bits, from the highest N-th bit to the lowest first bit, of an N-bit digital output signal, outputting the N-bit digital output signal and taking the output N-bit digital output signal as a previous N-bit digital output signal;

3) sampling the analog input signal for another time to acquire a new sampled signal; and 4) subjecting the new sampled signal acquired in step 3) to the SAR A/D conversion comprising the sub-steps of:

i) determining whether each of an M-th to a first bits of the previous N-bit digital output signal has a value of 1 or whether each of an M-th to a first bits of the previous N-bit digital output signal has a value of 0, looping back to step 2) if each of the M-th to first bits of the previous N-bit digital output signal has a value of 1 or if each of the M-th to first bits of the previous N-bit digital output signal has a value of 0, or proceeding to step ii) if the values of the M-th to first bits of the previous N-bit digital output signal are not all 1's or 0's, where M is an integer smaller than N and greater than 1; and ii) directly taking the N-th to (M+1)-th bits of the previous N-bit digital output signal as the N-th to (M+1)-th bits of a new N-bit digital output signal, subjecting the new sampled signal to each of the M-th SAR A/D conversion to the first SAR A/D conversion to obtain bits, from the M-th to first bits of the new N-bit digital output signal by conducting M conversions, taking the new N-bit digital output signal with the N-th to first bits as updated previous N-bit digital output signal, and repeating steps 3) and 4) until the analog input signal is fully sampled and A/D-converted.

9. The SAR A/D conversion method of claim 8, wherein the sequential steps are performed under a control of a clock signal wherein the sampling in each of steps 1) and 3) lasts for one clock cycle, and wherein the SAR A/D conversion in each of steps 2) and ii) is conducted one clock cycle latter after completion of the corresponding sampling.

10. The SAR A/D conversion method of claim 9, wherein each of the SAR A/D conversions lasts for one clock cycle, wherein the SAR A/D conversions in step 2) totally last for N clock cycles, and wherein the SAR A/D conversions in step ii) totally last for M clock cycles.

11. The SAR A/D conversion method of claim 8, wherein the sample-and-hold circuit and the N-bit DAC are implemented by a capacitor array and a switch array, and wherein the SAR control logic circuit controls states of switches in the switch array so as to enable sampling and the SAR A/D conversion.

12. The SAR A/D conversion method of claim 11, wherein the capacitor array is a multiple-stage capacitor array.

13. The SAR A/D conversion method of claim 11, wherein the capacitor array utilizes a binary-weighting scheme for setting capacitances of capacitors in the capacitor array.

14. The SAR A/D conversion method of claim 8, wherein N is 12.

15. The SAR A/D conversion method of claim 14, wherein M is 6.

* * * * *